(12) United States Patent
Wang

(10) Patent No.: US 11,693,449 B2
(45) Date of Patent: Jul. 4, 2023

(54) FRAME AND DISPLAY APPARATUS

(71) Applicant: BOE TECHNOLOGY GROUP CO., LTD., Beijing (CN)

(72) Inventor: Zifeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 17/609,819

(22) PCT Filed: Nov. 24, 2020

(86) PCT No.: PCT/CN2020/131042
§ 371 (c)(1),
(2) Date: Nov. 9, 2021

(87) PCT Pub. No.: WO2021/104237
PCT Pub. Date: Jun. 3, 2021

(65) Prior Publication Data
US 2022/0221904 A1 Jul. 14, 2022

(30) Foreign Application Priority Data
Nov. 25, 2019 (CN) .......................... 201922072970.3

(51) Int. Cl.
*G06F 1/16* (2006.01)
*H05K 7/14* (2006.01)

(52) U.S. Cl.
CPC .......... *G06F 1/1607* (2013.01); *H05K 7/1417* (2013.01)

(58) Field of Classification Search
CPC ..................... G06F 1/1607; H05K 7/1417
See application file for complete search history.

(56) References Cited

U.S. PATENT DOCUMENTS 7,070,156 B2 * 7/2006 Liao .................. F16M 11/2064
248/917
D530,595 S * 10/2006 Lam ............................. D8/373
(Continued)

FOREIGN PATENT DOCUMENTS

CN 201063740 5/2008
CN 201078876 6/2008
(Continued)

OTHER PUBLICATIONS

PCT International Search Report (w/ English Translation) for corresponding PCT Application No. PCT/CN2020/131042, dated Mar. 2, 2021, 7 pages.

*Primary Examiner* — Adrian S Wilson
(74) *Attorney, Agent, or Firm* — Dority & Manning, P.A.

(57) ABSTRACT

A frame includes a support assembly extending in a first direction, two hemming brackets, and at least two detachable fixing structures. The hemming brackets respectively disposed at both sides of the support assembly in the first direction. Each hemming bracket extends in a second direction different from the first direction. An end of the hemming bracket away from the support assembly is a flanged portion. The hemming bracket is fixed to a corresponding end of the support assembly through at least one detachable fixing structure. One of the hemming bracket and the end of the support assembly has at least one via hole, and each detachable fixing structure passing through a via hole to be fixed to another of the hemming bracket and the end of the support assembly. An outer wall of the detachable fixing structure and a hole wall of the via hole has a gap therebetween.

20 Claims, 8 Drawing Sheets

(56) References Cited

U.S. PATENT DOCUMENTS

| | | | |
|---|---|---|---|
| D563,962 S * | 3/2008 | Grey | D14/452 |
| 7,891,622 B1 * | 2/2011 | O'Keene | F16M 11/18 |
| | | | 248/920 |
| 8,203,854 B2 * | 6/2012 | Tsai | F16M 13/02 |
| | | | 248/327 |
| D703,641 S * | 4/2014 | Xiang | D14/239 |
| 9,010,699 B2 * | 4/2015 | Anderson | F16M 13/02 |
| | | | 361/825 |
| 10,030,813 B2 * | 7/2018 | Wang | F16M 11/08 |
| 10,047,902 B2 * | 8/2018 | Lukach | A47G 1/1606 |
| 10,689,859 B2 * | 6/2020 | Duranleau | E04F 13/23 |
| D904,361 S * | 12/2020 | Pei | D14/239 |
| D912,023 S * | 3/2021 | Lyu | D14/239 |
| D918,189 S * | 5/2021 | Lu | D14/239 |
| D919,630 S * | 5/2021 | Lyu | D14/451 |
| 11,385,679 B2 * | 7/2022 | Pyo | G09F 9/35 |
| 2007/0023593 A1 * | 2/2007 | Fedewa | F16M 13/02 |
| | | | 248/201 |
| 2008/0049163 A1 | 2/2008 | Lee | |
| 2022/0223073 A1 * | 7/2022 | Wang | G06F 1/266 |

FOREIGN PATENT DOCUMENTS

| | | |
|---|---|---|
| CN | 205016156 | 2/2016 |
| CN | 105450956 | 3/2016 |
| CN | 205943345 | 2/2017 |
| CN | 106704780 | 5/2017 |
| CN | 107121840 | 9/2017 |
| CN | 206789207 | 12/2017 |
| CN | 209267700 | 8/2019 |
| CN | 210378258 | 4/2020 |
| WO | WO2018215726 | 11/2018 |

* cited by examiner

FRAME AND DISPLAY APPARATUS

CROSS-REFERENCE TO RELATED APPLICATIONS

This application is a national phase entry under 35 USC 371 of International Patent Application No. PCT/CN2020/131042 filed on Nov. 24, 2020, which claims priority to Chinese Patent Application No. 201922072970.3, filed on Nov. 25, 2019, which are incorporated herein by reference in their entirety.

TECHNICAL FIELD

The present disclosure relates to the field of display technologies, and in particular, to a frame and a display apparatus.

BACKGROUND

An organic light-emitting diode (OLED) display apparatus is a flexible display apparatus made of organic light-emitting diodes, which has good display effect, wide temperature range, self-luminescence, and good application prospect.

Compared with a liquid crystal display (LCD), the OLED display apparatus has good bending performance, which makes the OLED display apparatus available for curved display.

SUMMARY

In an aspect, a frame is provided. The frame includes a support assembly, two hemming brackets, and at least two detachable fixing structures. The support assembly extends in a first direction. The two hemming brackets are respectively disposed at both sides of the support assembly in the first direction. Each hemming bracket extends in a second direction, and an end of the hemming bracket away from the support assembly is a flanged portion. The hemming bracket is fixed to a corresponding end of the support assembly through at least one detachable fixing structure. One of the hemming bracket and the end of the support assembly has at least one via hole, and each detachable fixing structure passes through one via hole to be fixed to another of the hemming bracket and the end of the support assembly. An outer wall of the detachable fixing structure and a hole wall of the via hole have a gap therebetween. The first direction and the second direction are different, and a plane in which the first direction and the second direction are located is perpendicular to a thickness direction of the frame.

In some embodiments, the hemming bracket includes a connection portion. The connection portion and the flanged portion form an L-shaped structure. The connection portion and the end of the support assembly are stacked in the thickness direction of the frame, and the at least one via hole is disposed in one of the connection portion and the end of the support assembly.

In some embodiments, an angle formed by the connection portion and the flanged portion at a connection therebetween is an arc-shaped chamfering.

In some embodiments, the connection portion includes a first connection sub-portion and a second connection sub-portion. The first connection sub-portion is located between the second connection sub-portion and the flanged portion, and is connected to the second connection sub-portion and the flanged portion. The first connection sub-portion and the support assembly are non-overlapping in the thickness direction of the frame. The second connection sub-portion and the end of the support assembly are stacked in the thickness direction of the frame. The at least one via hole is disposed in the second connection sub-portion.

In some embodiments, at least one threaded hole is disposed on a surface of the end of the support assembly facing the second connection sub-portion. The detachable fixing structure includes a fastener with a thread. The fastener with the thread passes through a via hole disposed in the second connection sub-portion to be fixedly connected to a corresponding threaded hole, and the via hole is a counter bore.

In some embodiments, the support assembly has an upper surface and a lower surface disposed oppositely. A portion of the lower surface at each end of the support assembly is recessed toward the upper surface relative to a portion of the lower surface in a remaining region of the support assembly. The second connection sub-portion is located at a side of the lower surface of the support assembly. The connection portion has a top surface and a bottom surface disposed oppositely, and a portion of the top surface in the second connection sub-portion is in contact with a portion of the lower surface at the end of the support assembly.

In some embodiments, the bottom surface of the connection portion and the portion of the lower surface in the remaining region of the support assembly are located in a same plane, and the plane is perpendicular to the thickness direction of the frame.

In some embodiments, the upper surface is an arc-shaped surface. An extending direction of an orthographic projection of each of curved sides of the arc-shaped surface on the plane is parallel to the first direction, and the arc-shaped surface and the flanged portion are located at a same side of the frame. A portion of the top surface in the first connection sub-portion is an inclined surface, and the inclined surface is tangent to an edge of the arc-shaped surface proximate to the inclined surface.

In some embodiments, the support assembly includes at least one support member, each support member is in an arcuate shape, and an upper surface of the support member is an arc-shaped surface. An extending direction of an orthographic projection of each of curved sides of the arc-shaped surface on the plane is parallel to the first direction, and the arc-shaped surface and the flanged portion are located at the same side of the frame.

In some embodiments, the support assembly includes at least two support members, and any two adjacent support members of the at least two support members are spaced apart in the second direction. An end of each support member is fixed to the hemming bracket through at least one detachable fixing structure.

In some embodiments, at least one opening is disposed on each support member, and the at least one opening penetrates the support member in the second direction.

In some embodiments, the frame further includes at least one bracket, and each bracket extends in the second direction. The at least one bracket is disposed between the two hemming brackets, and is fixedly connected to the at least two support members.

In some embodiments, a plurality of mounting holes are disposed on the support assembly, the bracket and the hemming brackets. The plurality of mounting holes and the flanged portion are located at the same side of the frame, and the plurality of mounting holes are uniformly distributed.

In another aspect, a display apparatus is provided. The display apparatus includes the frame as described in any one of the above embodiments and a display assembly. The display assembly includes a display panel and a backplate. The backplate is disposed on the support assembly and is in contact with the support assembly. The display panel is located at a side of the backplate away from the support assembly. The two hemming brackets are respectively located at two edges of the display assembly in the first direction.

In some embodiments, the display assembly is a curved display assembly.

In some embodiments, the display assembly further includes two protection frames. The two protection frames are disposed at two edges of the display assembly that are oppositely disposed in the second direction. Each protection frame is in contact with one of two side faces of the display panel that are oppositely disposed in the second direction.

In some embodiments, the protection frame includes a side frame and an elastic clamping portion connected to the side frame. The elastic clamping portion is clamped into a gap between the backplate and the display panel. The side frame is in contact with a side face of the display panel. The protection frame further includes a position-limiting platform disposed at an edge of a surface of the elastic clamping portion away from the display panel. An edge portion of the backplate is disposed on the surface of the elastic clamping portion away from the display panel, and a side face of the backplate located at the edge portion and a side wall of the position-limiting platform have a gap therebetween.

In some embodiments, the display assembly further includes at least one first driving circuit board. The at least one first driving circuit board is disposed at at least one edge of two edges of the display panel that are oppositely disposed in the second direction. Each first driving circuit board is located at a side of the display panel proximate to the backplate and extends beyond the edge of the display panel. The first driving circuit board is located among the side frame, the elastic clamping portion, and the display panel.

In some embodiments, the display assembly further includes at least one second driving circuit board. The at least one second driving circuit board is disposed at at least one edge of two edges of the display panel that are oppositely disposed in the first direction, Each second driving circuit board is located at the side of the display panel proximate to the backplate, and an orthographic projection of the second driving circuit board on the backplate is located within a range of an orthographic projection of the display panel on the backplate.

In some embodiments, a plurality of mounting holes are disposed on the frame. A plurality of protrusions are disposed on a surface of the backplate facing the support assembly, and the plurality of protrusions are configured to cooperate with the plurality of mounting holes.

BRIEF DESCRIPTION OF THE DRAWINGS

In order to describe technical solutions in the present disclosure more clearly, the accompanying drawings to be used in some embodiments of the present disclosure will be introduced briefly below, Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1A:
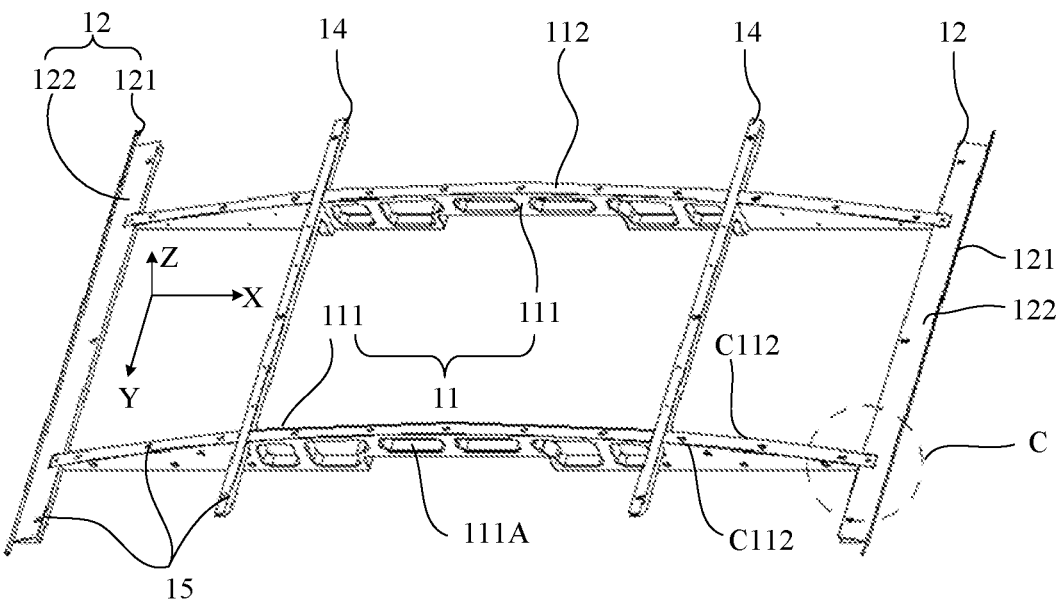
FIG. 1A is a structural diagram of a frame, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims; the term "comprise" and other forms thereof such as the third-person singular form "comprises" and the present participle form "comprising" are construed as an open and inclusive meaning, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes; and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, the term "connected" and its derivatives may be used. For example, the term "connected" may be used in the description of some embodiments to indicate that two or more components are in direct or indirect contact with each other. The embodiments disclosed herein are not necessarily limited to the contents herein.

The use of the phrase "applicable to" or "configured to" herein means an open and inclusive language, which does not exclude devices that are applicable to or configured to perform additional tasks or steps.

Exemplary embodiments are described herein with reference to sectional views and/or plan views as idealized exemplary drawings. The exemplary embodiments should not be construed as being limited to the shapes shown herein, but include shape deviations due to, for example, manufacturing.

Some embodiments of the present disclosure provide a frame. As shown in FIGS. 1A and 1B, and FIGS. 2A and 2B, the frame 1 includes a support assembly 11, two hemming brackets 12, and at least two detachable fixing structures 13.

The support assembly 11 extends in a first direction X, and the two hemming brackets 12 are respectively disposed at both sides of the support assembly 11 in the first direction X. Each hemming bracket 12 extends in a second direction Y, and an end of the hemming bracket 12 away from the support assembly 11 is a flanged portion 121. The first direction X and the second direction Y are different, and a plane in which the first direction X and the second direction Y are located is perpendicular to a thickness direction Z of the frame 1. In some embodiments, the first direction X is perpendicular to the second direction Y.

Figure 2A:
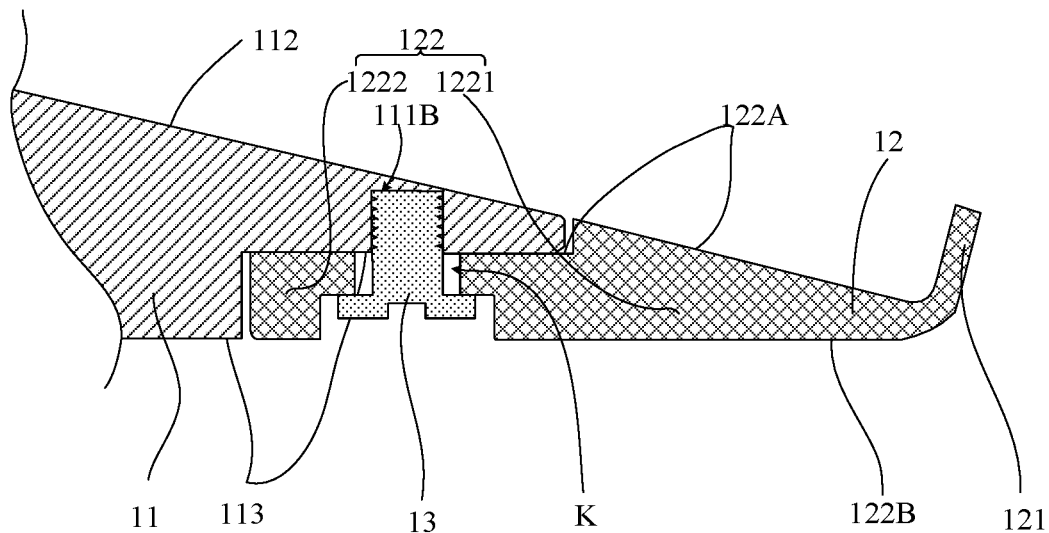
FIG. 2A is a sectional view of the region indicated by C in FIG. 1A.
Figure 2B:
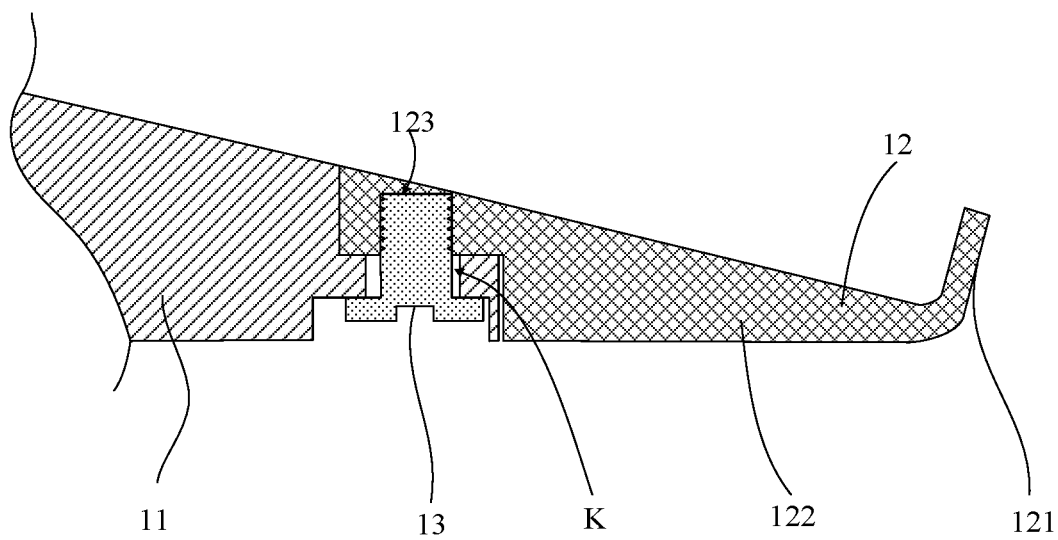
FIG. 2B is another sectional view of the region indicated by C in FIG. 1A.

As shown in FIGS. 2A and 2B, each hemming bracket 12 is fixed to a corresponding end of the support assembly 11 through at least one detachable fixing structure 13. That is, one of the two hemming brackets 12 is fixed to one end of the support assembly 11 through at least one detachable fixing structure 13, and the other of the two hemming brackets 12 is fixed to the other end of the support assembly 11 through at least one detachable fixing structure 13. Accordingly, the two hemming brackets 12 are connected through the support assembly 11. In some embodiments, the hemming bracket 12 is fixed to the corresponding end of the support assembly 11 through a plurality of detachable fixing structures 13.

One of each hemming bracket 12 and the end of the support assembly 11 has at least one via hole K, and each detachable fixing structure 13 passes through one via hole K to be fixed to the other of each hemming bracket 12 and the end of the support assembly 11. In some examples, as shown in FIG. 2A, the hemming bracket 12 has at least one via hole K, and each detachable fixing structure 13 passes through one via hole K to be fixed to the end of the support assembly 11. In some other examples, as shown in FIG. 2B, the end of the support assembly 11 has at least one via hole K, and each detachable fixing structure 13 passes through one via hole K to be fixed to the hemming bracket 12. In a case where the hemming bracket 12 is fixed to the corresponding end of the support assembly 11 through a plurality of detachable fixing structures 13, in some examples, one of the hemming bracket 12 and the end of the support assembly 11 has one via hole K, and each detachable fixing structure 13 passes through the via hole K to be fixed to the other of the hemming bracket 12 and the end of the support assembly 11. In some other examples, one of the hemming bracket 12 and the end of the support assembly 11 has a plurality of via holes K, the plurality of via holes K are in a one-to-one correspondence with the plurality of detachable fixing structures 13 and each detachable fixing structure 13 passes through a corresponding via hole K to be fixed to the other of the hemming bracket 12 and the end of the support assembly 11.

There is a gap between an outer wall of the detachable fixing structure 13 and a hole wall of the via hole K, so as to enable the hemming bracket 12 and the support assembly 11 to move relatively when the support assembly 11 and the hemming bracket 12 are assembled, thereby adjusting a relative position between the hemming bracket and the support assembly 11. In some embodiments, the hemming bracket 12 moves in the first direction X relative to the support assembly 11 when the support assembly 11 and the hemming bracket 12 are assembled, and after the adjustment of the relative position between the hemming bracket 12 and the support assembly 11, the hemming bracket 12 and the support assembly 11 are completely locked through the detachable fixing structure 13, so that a relative movement between the hemming bracket 12 and the support assembly 11 does not occur any more.

It will be noted that, a maximum distance that the hemming bracket 12 and the support assembly 11 may move relatively to each other may be set according to actual needs. Based on this, the set maximum distance may be achieved by reasonably setting a size of the via hole K and a size of the detachable fixing structure 13.

When the frame 1 and a component to be fixed (e.g., a display assembly) are assembled, the component to be fixed is disposed at a side of the support assembly 11 in the thickness direction Z of the frame 1, and flanged portions 121 of the two hemming brackets 12 are located at both sides of the component to be fixed in the first direction X. Each flanged portion 121 is opposite to one of two opposite side faces of the component to be fixed in the first direction X, so as to protect the side face. In some examples, a distance between the flanged portion 121 and the side face of the component to be fixed is less than or equal to a preset width. The preset width may be set according to actual conditions. For example, the preset width is less than or equal to 1 mm. Since the relative position of the hemming bracket 12 and the support assembly 11 in the first direction X is adjustable, a distance between the flanged portions 121 of the two hemming brackets 12 is adjustable. As a result, the distance between the flanged portion 121 and the side face of the component to be fixed may be adjusted, so that the distance may be adjusted to be within a desired range. Since there is an arrangement of the detachable fixing structure 13 in the frame 1, when the frame 1 and the component to be fixed are assembled, the relative position of the hemming bracket 12 and the support assembly 11 in the first direction X may be adjusted at any time by operating the detachable fixing structure 13.

In some embodiments, as shown in FIGS. 2A and 2B, the hemming bracket 12 further includes a connection portion 122, The connection portion 122 and the flanged portion 121 form an L-shaped structure. The connection portion 122 and the end of the support assembly 11 are stacked in the thickness direction Z of the frame 1, and the at least one via hole K is disposed in one of the connection portion 122 and the end of the support assembly 11. In some examples, as shown in FIG. 2A, the at least one via hole K is disposed in the connection portion 122, and each detachable fixing structure 13 passes through one via hole K to be fixed to the end of the support assembly 11. In some other examples, as shown in FIG. 2B, the at least one via hole K is disposed in the end of the support assembly 122, and each detachable fixing structure 13 passes through one via hole K to be fixed to the connection portion 11.

Figure 3:
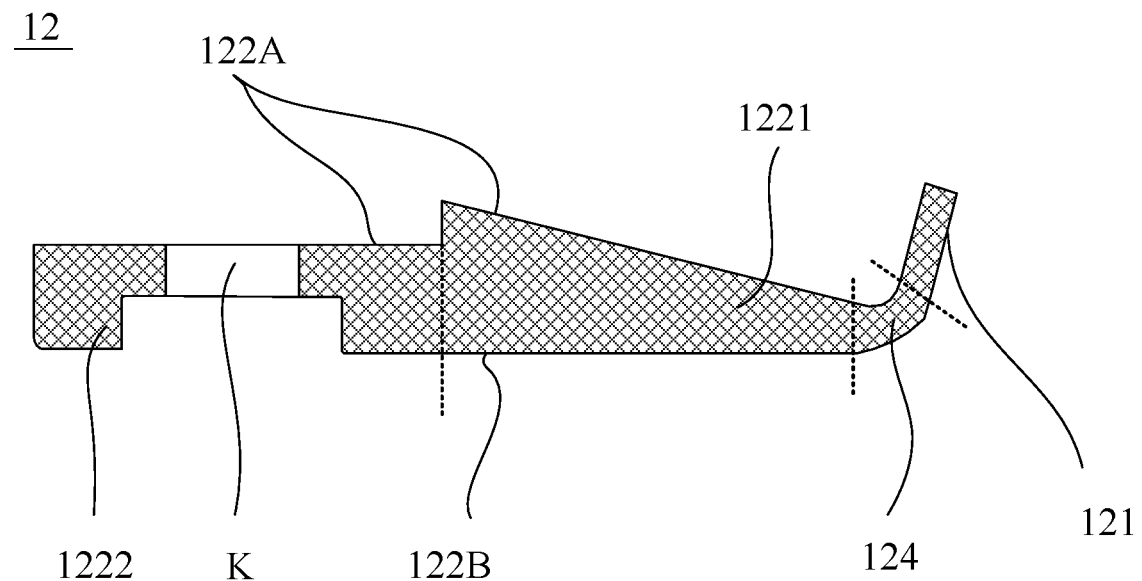
FIG. 3 is a sectional view of a hemming bracket, in accordance with some embodiments.

As shown in FIG. 3, in some examples, an angle formed by the connection portion 122 and the flanged portion 121 at a connection therebetween is an arc-shaped chamfering 124. In this way, the connection portion 122 and the flanged portion 121 are smoothly transited at a connecting position, which avoids stress concentration, thereby improving structural performance. In addition, presence of burrs may also be avoided to prevent damage to the component to be fixed.

In some examples, as shown in FIGS. 2A and 3, the connection portion 122 includes a first connection sub-portion 1221 and a second connection sub-portion 1222. The first connection sub-portion 1221 is located between the second connection sub-portion 1222 and the flanged portion 121, and the first connection sub-portion 1221 is connected to the second connection sub-portion 1222 and the flanged portion 121. The second connection sub-portion 1222 and the end of the support assembly 11 are stacked in the thickness direction Z of the frame 1, and the first connection sub-portion 1221 and the support assembly 11 are non-overlapping in the thickness direction Z of the frame 1. In embodiments in which the at least one via hole K is disposed in the connection portion 122, the at least one via hole K is disposed in the second connection sub-portion 1222.

In some embodiments, as shown in FIG. 2A, at least one threaded hole is disposed at a surface of the end of the support assembly 11 facing the second connection sub-portion 1222 (for convenience of description, the threaded hole is hereinafter referred to as a first threaded hole 111B). The detachable fixing structure 13 includes a fastener with a thread, and the fastener with the thread passes through one via hole K disposed in the second connection sub-portion 1222 to be fixedly connected to a corresponding first threaded hole 111B. Herein, the first threaded hole 111B may or may not penetrate the end of the support assembly 11.

In some examples, the via hole K is a counter bore, and the fastener with the thread is placed in the counter bore. The fastener with the thread does not protrude out of a surface of the second connection sub-portion 1222 away from the support assembly 11, so that an outer surface of the frame 1 at this position is flat.

In some other examples, the via hole K is a waist shaped hole, and a length of the via hole K in the first direction X is greater than a width of the via hole K in the second direction Y.

For example, the fastener with the thread is a bolt. The bolt includes a screw and a nut. The screw of the bolt extends into the first threaded hole 111B after passing through the via hole K. By rotating the screw, a depth of the screw into the support assembly 22 gradually increases, and when a surface of the nut facing the screw is pressed against the second connection sub-portion 1222, and a surface of the second connection sub-portion 1222 facing the support assembly 11 is also pressed against the support assembly 11, the hemming bracket 12 is fixedly connected to the support assembly 11.

As another example, the fastener with the thread is a double-end stud. The detachable fixing structure 13 further includes a nut, and the nut is sleeved on one end of the double-end stud. The other end of the double-end stud extends into the first threaded hole 111B after passing through the via hole K. By rotating the screw, a depth of the double-end stud into the support assembly 22 gradually increases, and when a surface of the nut facing the support assembly 11 is pressed against the second connection sub-portion 1222, and the surface of the second connection sub-portion 1222 facing the support assembly 11 is also pressed against the support assembly 11, the hemming bracket 12 is fixedly connected to the support assembly 11.

In some other embodiments, as shown in FIG. 2B, the end of the support assembly 11 has at least one via hole K, and at least one second threaded hole 123 is disposed at a surface, of the connection portion 122 of the hemming bracket 12, facing the end of the support assembly 11. The detachable fixing structure 13 includes a fastener with a thread, and the fastener with the thread passes through one via hole K disposed at the end of the support assembly 11 to be fixedly connected to a corresponding second threaded hole 123. Herein, the second threaded hole 123 may or may not penetrate the connection portion 122. For an exemplary structure of the fastener with the thread, reference may be made to the above, which will not be repeated herein.

In some embodiments, as shown in FIGS. 2A and 23, the support assembly 11 has an upper surface 112 and a lower surface 113 disposed oppositely. A portion of the lower surface 113 at each end of the support assembly 11 is recessed toward the upper surface 112 relative to a portion of the lower surface 113 in a remaining region of the support assembly 11. The second connection sub-portion 1222 is located at a side of the lower surface 113 of the support assembly 11. That is, the end of the support assembly 11 has a cutaway groove, and the second connection sub-portion 1222 extends into the cutaway groove. The connection portion 122 has a top surface 122A and a bottom surface 122E that are disposed oppositely. A portion of the top surface 122A at the second connection sub-portion 1222 is in contact with a portion of the lower surface 113 of the support assembly 11 at the end of the support assembly 11.

In some examples, as shown in FIG. 2A, the bottom surface 122E of the connection portion 122 and the portion of the lower surface 113 of the support assembly 11 in the remaining region of the support assembly 11 are located in a same plane, and the plane is perpendicular to the thickness direction Z of the frame 1. After the hemming bracket 12 and the support assembly 11 are assembled, the bottom surface 1223 of the connection portion 122 and the portion of the lower surface 113 of the support assembly 11 in the remaining region of the support assembly 11 constitute a lateral outer surface of the frame 1, so that the lateral outer surface of the frame 1 is flat. In this way, the lateral outer surface of the frame 1 may be directly placed on a mounting table, and the frame 1 may be used as an assembly jig of the component to be fixed, so that additional jigs are reduced.

Figure 13:
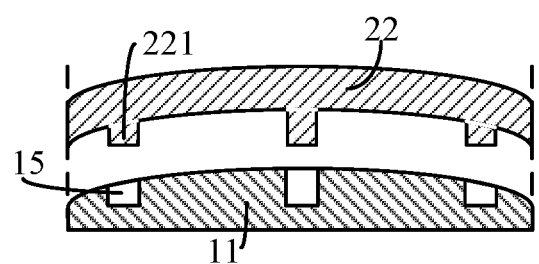
FIG. 13 is a schematic diagram of protrusions and mounting holes, in accordance with some embodiments.

In some embodiments, as shown in FIGS. 1A and 13, the upper surface 112 of the support assembly 11 is an arc-shaped surface, an extending direction of an orthographic projection of each of curved sides C112 of the arc-shaped surface on the plane in which the first direction X and the second direction Y are located is parallel to the first direction X, and the arc-shaped surface and the flanged portion 121 are located at the same side of the frame 1. For example, the component to be fixed has a curved surface structure, and the arc-shaped surface may be suitably connected to the curved surface of the component to be fixed, and the flanged portion 121 protects a side face of the component to be fixed, so that the frame 1 may be applied to the component to be fixed with the curved surface structure.

In some examples, as shown in FIG. 2A, a portion of the top surface 122A of the connection portion 122 in the first connection sub-portion 1221 is an inclined surface, and the inclined surface is tangent to an edge of the arc-shaped surface of the support assembly 11 proximate to the inclined surface. In this way, the inclined surface and the edge of the arc-shaped surface may be smoothly transited without a sharp transition portion. Accordingly, when the component to be fixed is in contact with a transition portion of the inclined surface and the arc-shaped surface, the component to be fixed may not be scratched by the transition portion.

Figure 1B:
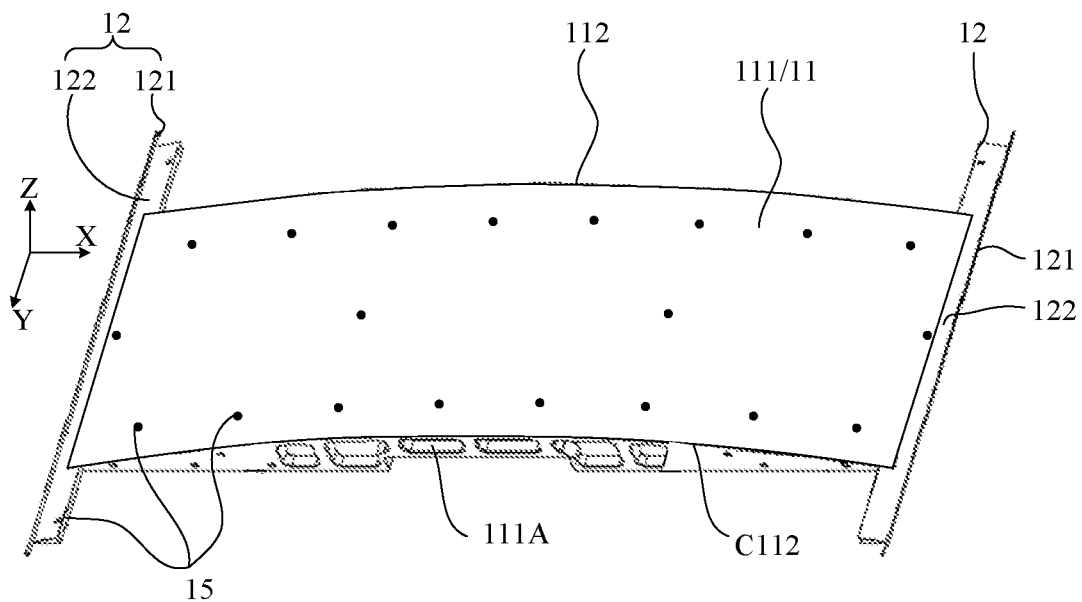
FIG. 1B is a structural diagram of another frame, in accordance with some embodiments.
Figure 4:
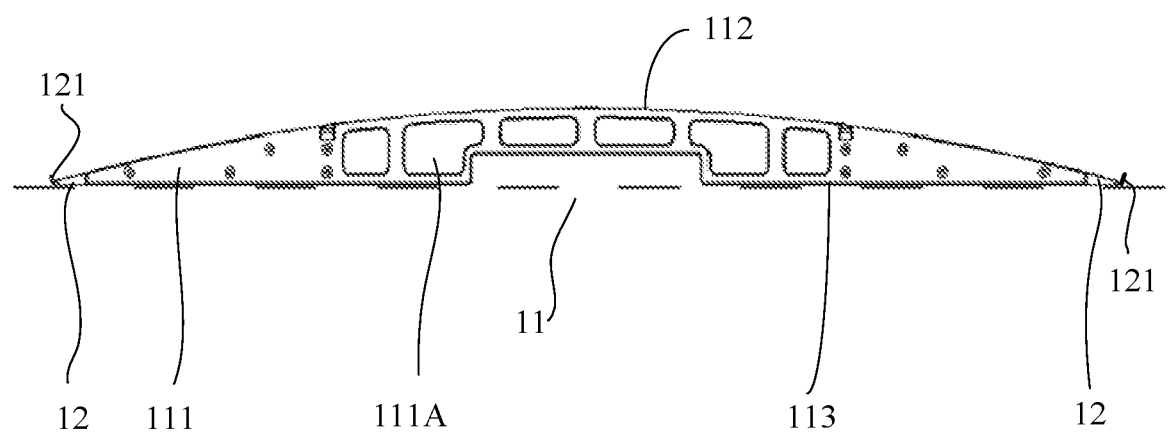
FIG. 4 is a side view of a frame, in accordance with some embodiments.

In some embodiments, as shown in FIGS. 1A and 1B, the support assembly 11 includes at least one support member 111, As shown in FIGS. 1A, 1B, and 4, each support member 111 is in an arcuate shape, and the upper surface 112 of the support member 111 is an arc-shaped surface. An extending direction of an orthographic projection of each of curved sides C112 of the arc-shaped surface on the plane in which the first direction X and the second direction Y are located is parallel to the first direction X, and the arc-shaped surface and the flanged portion 121 are located at the same side of the frame 1.

As shown in FIG. 1A, in some examples, the support assembly 11 includes at least two support members 111, and any two adjacent support members 111 of the at least two support members 111 are space apart in the second direction Y. An end of each support member 111 is fixed to one hemming bracket 12 through at least one detachable fixing structure 13, and the other end is fixed to the other hemming bracket 12 through at least one detachable fixing structure 13. Herein, the two hemming brackets 12 are connected through at least two support members 111 to form the frame 1 of a stable structure.

Based on this, in some examples, as shown in FIG. 1A, the frame 1 further includes at least one bracket 14, and each bracket 14 extends in the second direction Y. The at least one bracket 14 is disposed between the two hemming brackets 12, and the at least one bracket 14 and the at least two support members 111 are fixedly connected.

In some examples, the at least one bracket 14 includes two brackets 14, and the two brackets 14 are space apart in the first direction X. A distance between one bracket 14 and a corresponding hemming bracket 12 is equal to a distance between the other bracket 14 and the other corresponding hemming bracket 12.

In some examples, as shown in FIGS. 1A, 1B, and 4, at least one opening 111A is disposed on each support member 111, and the at least one opening 111A penetrates the support member 111 in the second direction Y. by providing the opening 111A, the support member 111 may be hollowed out at a position where the opening 111A is located, so as to reduce a weight of the support member 111 on the premise that a structural performance of the support member 111 is not affected. Moreover, the opening 111A may be used as a storage space for other components, so as to increase a storage capacity of the frame 1. In addition, the opening 111A may be used as a heat-dissipating channel to increase a speed of heat dissipation and enhance a heat-dissipating capability of the frame 1.

In some examples, as shown in FIG. 1A, a plurality of mounting holes 15 are disposed on the support assembly 11, the bracket 14 and the hemming brackets 12. The plurality of mounting holes 15 and the flanged portions 121 are located at the same side of the frame 1. In this way, by providing a plurality of protrusions on the component to be fixed, when the frame 1 and the component to be fixed are assembled, the connection between the frame 1 and the component to be fixed may be made tight by matching the plurality of protrusions into the plurality of mounting holes 15 in a one-to-one correspondence manner, which avoids local warping.

In some examples, the plurality of mounting holes 15 are uniformly distributed, so that a connection force between the frame 1 and the component to be fixed is uniformly dispersed, and stress concentration is avoided.

For example, as shown in FIG. 1A, N mounting holes 15 are disposed on each hemming bracket 12, and the N mounting holes 15 are spaced apart in the second direction Y. N mounting holes 15 are disposed on each bracket 14, and the N mounting holes 15 are spaced apart in the second direction Y. All the mounting holes 15 on the hemming brackets 12 and the brackets 14 are arranged in N rows, and a plurality of mounting holes 15 in each row are spaced apart in the first direction X. In a case where the support assembly 11 includes at least two support members 111, M mounting holes 15 are disposed on each support member 111, and the M mounting holes 15 are spaced apart in the first direction X. All the mounting holes 15 on the support members 111 are arranged in M columns, and a plurality of mounting holes 15 in each column are spaced apart in the second direction Y. For example, N is 3 and M is 11.

Figure 5:
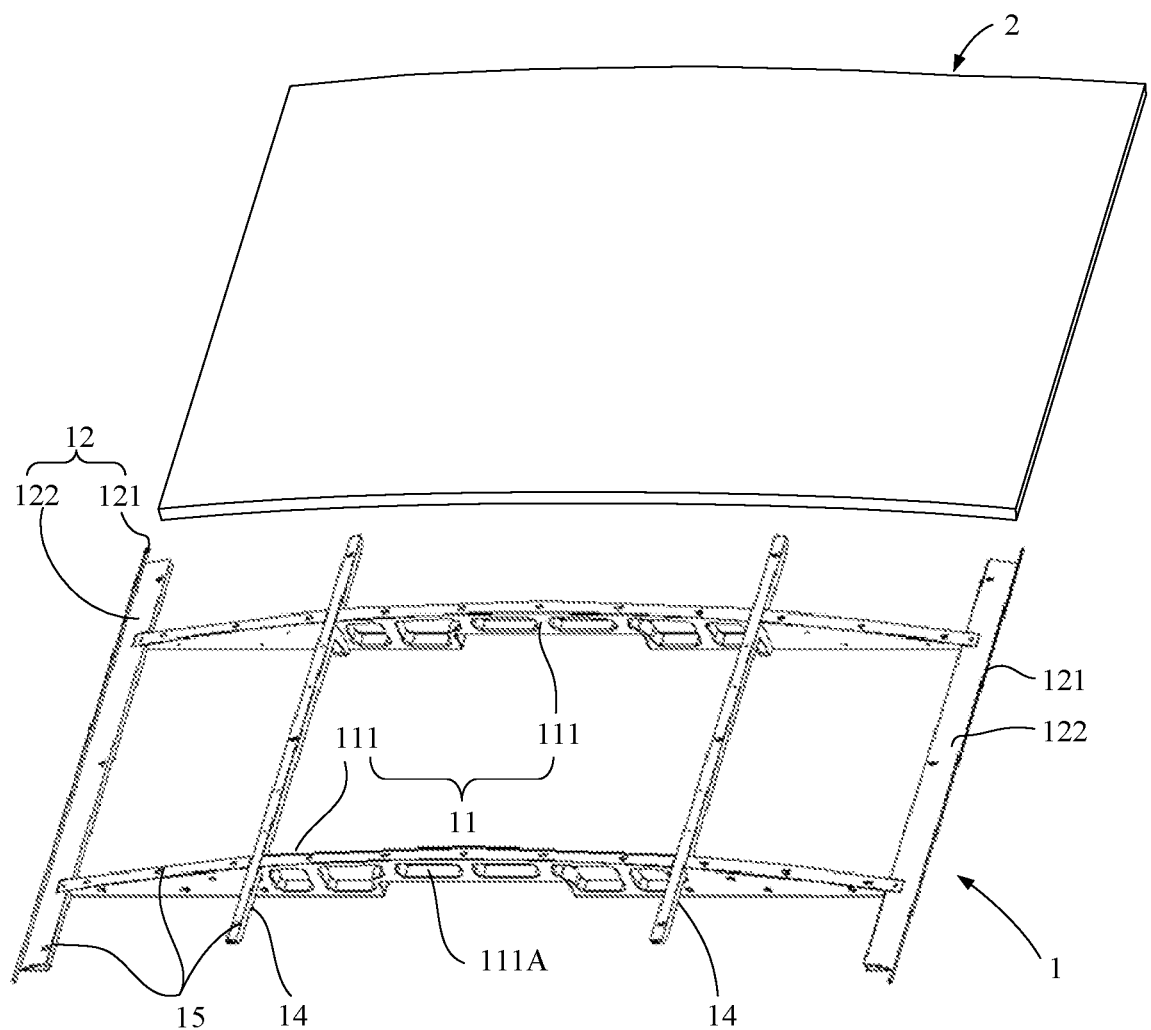
FIG. 5 is an exploded view of a display apparatus, in accordance with some embodiments.
Figure 6:
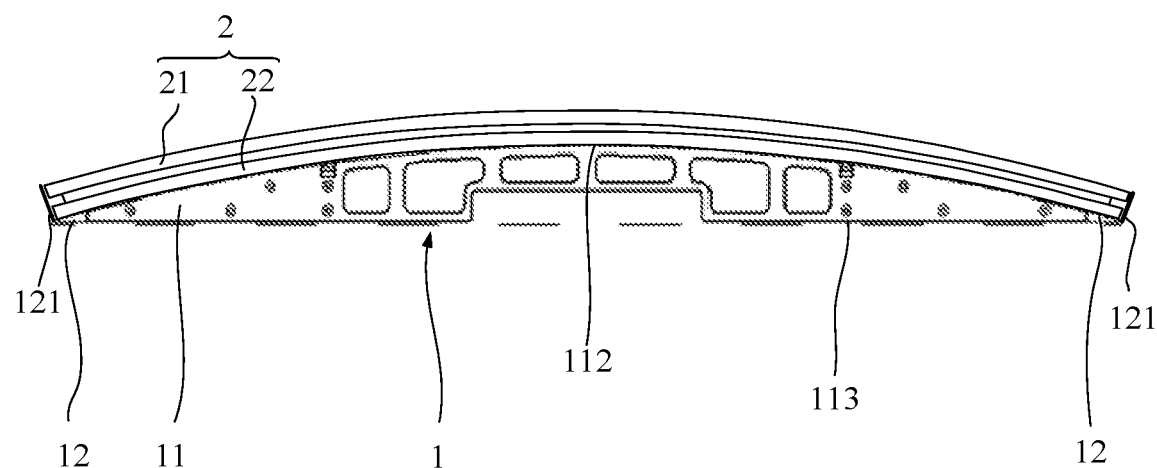
FIG. 6 is a side view of a display apparatus, in accordance with some embodiments.
Figure 7:
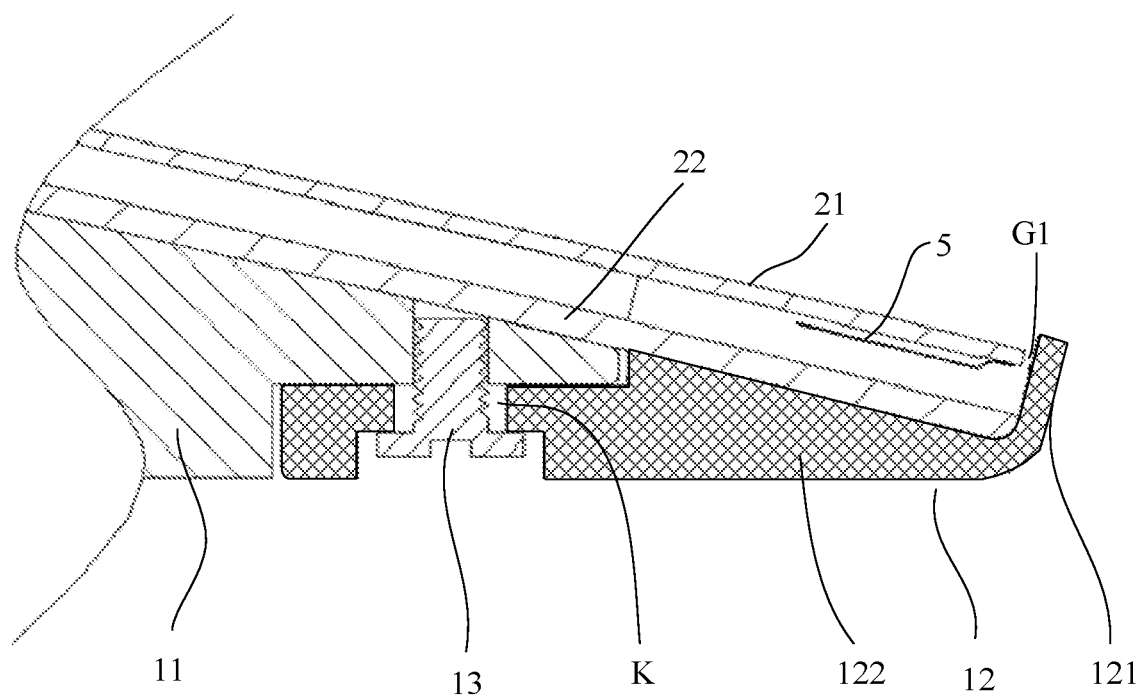
FIG. 7 is a structural diagram of an edge of a display apparatus, in accordance with some embodiments.

Some embodiments of the present disclosure provide a display apparatus. As shown in FIGS. 5 to 7, the display apparatus 100 includes a display assembly 2 and the frame 1 described above. The display assembly 2 is the component to be fixed described above.

The display assembly 2 includes a display panel 21 and a backplate 22. The backplate 22 is disposed on the support assembly 11 and is in contact with the support assembly 11. The display panel 21 is located at a side of the backplate 22 away from the support assembly 11. The two hemming brackets 12 are located at two edges of the display assembly 2 in the first direction X, and the flanged portion 121 of each hemming bracket 12 is opposite to one edge of the display assembly 2 in the first direction X to protect the edge.

The display panel 21 may be fixed to the backplate 22 in a variety of ways. For example, the display panel 21 bonds with the backplate 22 using an adhesive material.

In a case where a material of the backplate 22 is a metal conductive material, an insulating film layer is further disposed on a surface of the backplate 22 proximate to the display panel 21, so as to prevent the backplate 22 from conducting electricity and affecting normal operation of the display panel 21. The insulating film layer may be a film layer made of insulating tape or other insulating materials. In a case where the insulating film layer is double-sided tape, the display panel 21 may be directly disposed on the backplate 22 using the double-sided tape.

Since relative positions of the hemming brackets 12 and the support assembly 11 in the frame 1 in the first direction X may be adjusted, a distance between the flanged portion 121 and a side face of the display assembly 2 opposite to and proximate to the flanged portion 121 may be adjusted during a process of assembling the display assembly 2 and the frame 1, so that the distance is adjusted to be within a desired range.

In some embodiments, the display assembly 2 is a curved display assembly.

In some examples, an extending direction of a side of a projection of the curved display assembly on a plane perpendicular to a thickness direction Z of the curved display assembly is parallel to the first direction X, and an extending direction of another side of the projection of the curved display assembly on the plane is parallel to the second direction Y, and the side and the another side are two adjacent sides of the projection of the curved display assembly on the plane. For example, an extending direction of long sides of the projection of the curved display assembly 2 on the plane is parallel to the first direction X, and an extending direction of short sides of the projection of the curved display assembly 2 on the plane is parallel to the second direction Y. As another example, an extending direction of a projection of each of curved sides of a surface of the curved display assembly 2 on the plane away from the frame 1 is parallel to the first direction X, and an extending direction of non-curved sides of the surface of the curved display assembly 2 away from the frame 1 is parallel to the second direction Y.

Figure 8A:
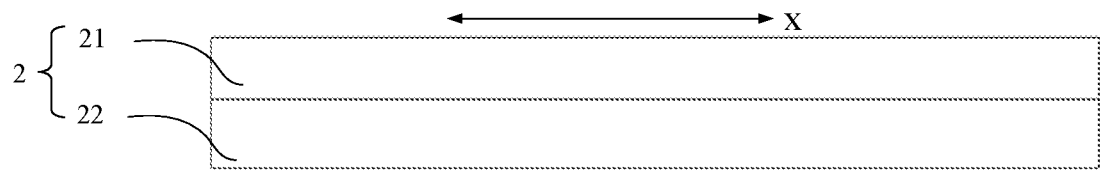
FIG. 8A is a structural diagram of a curved display assembly before bending, in accordance with some embodiments.

For the curved display assembly, both the display panel 21 and the backplate 22 are curved. In some examples, as shown in FIG. 8A, the display panel 21 and the backplate 22 are assembled in a planar structure first. Then, when the display panel 21 and the backplate 22 that are assembled together are assembled with the frame 1, the display panel 21 and the backplate 22 are bent to obtain the curved display assembly. Since materials of the display panel 21 and the backplate 22 are different, and characteristics of the display panel 21 and the backplate 22 are different, which leads to different deformation capacities of the display panel 21 and the backplate 22 during the bending process, so that the display panel 21 and the backplate 22 that are bent have certain misalignment on a side of the curved display assembly. Moreover, as bending degrees of the display panel 21 and the backplate 22 increase, the misalignment will become more and more serious.

Figure 8B:
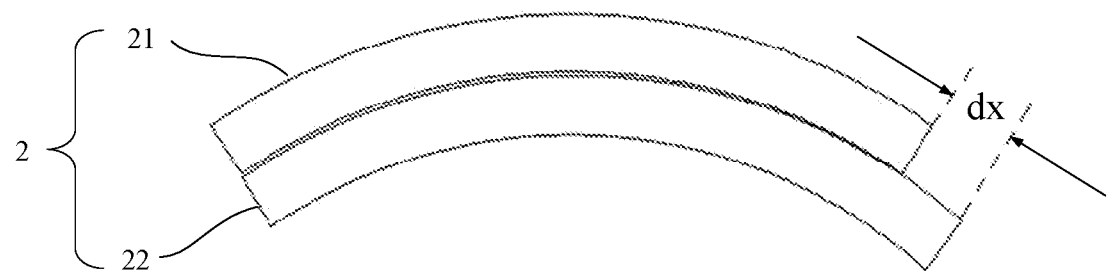
FIG. 8B is a structural diagram of a curved display assembly after bending, in accordance with some embodiments.

For example, as shown in FIG. 8B, the display panel 21 and the backplate 22 are bent downward. An extending direction of a projection of each of curved sides of a surface of the display panel 21 on the plane away from the frame 1 is parallel to the first direction X, and an extending direction of non-curved sides of the surface of the display panel 21 away from the frame 1 is parallel to the second direction Y. Since the deformation capacities of the display panel 21 and the backplate 22 are different during the bending process, there is a misalignment dx between a face of the display panel 21 and a corresponding face of the backplate 22 in the first direction X, so that the face of the display panel 21 cannot be aligned with the corresponding face of the backplate 22.

Although the misalignment may be controlled during manufacturing of the display panel 21 and the backplate 22, and a degree of the misalignment may be reduced to a certain extent, a phenomenon of the misalignment of the display panel 21 and the backplate 22 after bending is still inevitable because a curvature radius of the curved display assembly in actual bending and a curvature radius thereof in design cannot be completely matched. Meanwhile, misalignment degrees are poor in consistency, and different misalignments may be presented on different curved display assemblies.

As shown in FIG. 7, when the frame 1 in the embodiments of the present disclosure is used to be assembled with the curved display assembly, since the relative positions of the hemming brackets 12 and the support assembly 11 are adjustable, the relative positions of the hemming brackets 12 and the support assembly 11 may be adjusted according to actual situations of the curved display assembly, thereby adjusting a distance G1 between the flanged portion 121 and the side face of the curved display assembly. As a result, the distance G1 may be adjusted to be within a prescribed range, so that gaps on edges of different display apparatuses 100 are substantially equal to meet consistency requirements of industrial production.

Figure 9:
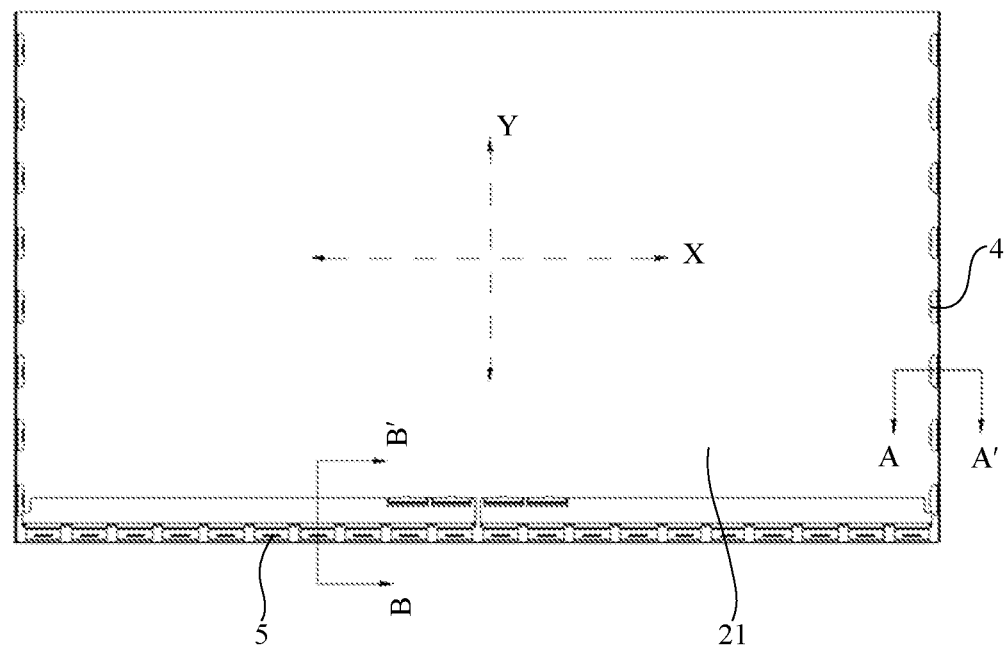
FIG. 9 is a top view of a display assembly, in accordance with some embodiments.
Figure 10:
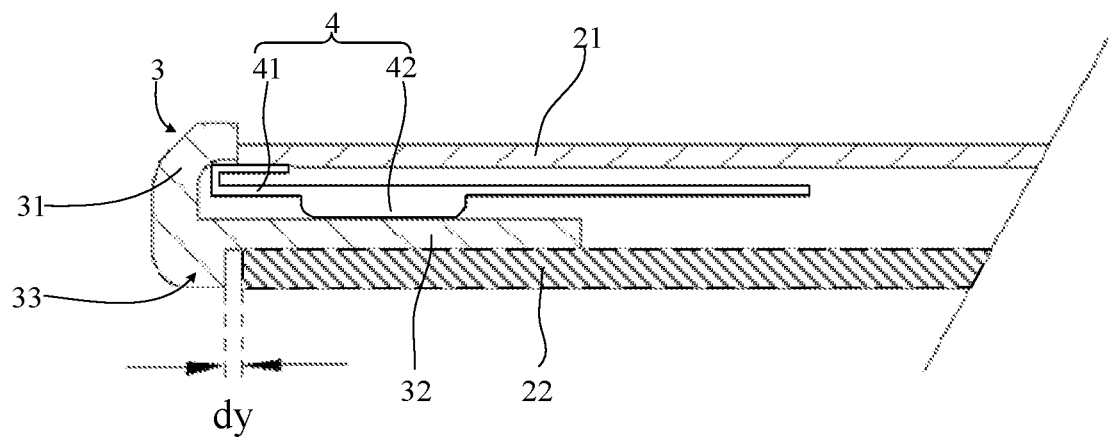
FIG. 10 is a sectional view taken along the line A-A' in FIG. 9.

In some embodiments, as shown in FIGS. 9 and 10, the display assembly 2 further includes two protection frames 3. The two protection frames 3 are disposed at two edges, of the display assembly 2, that are oppositely disposed in the second direction Y. Each protection frame 3 is in contact with one of two side faces, of the display panel 21, that are oppositely disposed in the second direction Y. In this way, it is possible to reduce or eliminate a gap between the protection frame 3 and the side face of the display panel 21, improve a reliability of the display apparatus 100, and ensure an aesthetic appearance of the display device 100.

In some examples, as shown in FIG. 10, the protection frame 3 includes a side frame 31 and an elastic clamping portion 32 connected to the side frame. The elastic clamping portion 32 is clamped into the edge of the display assembly 2 and the gap between the backplate 22 and the display panels 21. The side frame 31 is in contact with the side face of the display panel 21. The elastic clamping portion 32 may be elastically deformed, which generates elastic force enabling the elastic clamping portion 32 to be fixed in the gap and not to be separated from the gap.

In some examples, as shown in FIG. 10, the protection frame 3 further has a position-limiting platform 33 at an edge of a surface of the elastic clamping portion 32 away from the display panel 21. An edge portion of the backplate 22 is disposed on the surface of the elastic clamping portion 32 away from the display panel 21, and there is a gap dy between a side face of the backplate 22 located at the edge portion and a side wall of the position-limiting platform 33. In this way, a squeeze between the protection frame 3 and the backplate 22 and a displacement of the protection frame 3 may be avoided, and a reliable contact between the protection frame 3 and the side face of the display panel 21 may be further ensured.

In some embodiments, as shown in FIGS. 9 and 10, the display assembly 2 further includes at least one first driving circuit board 4, and the at least one first driving circuit board 4 is disposed at at least one edge of two edges, of the display panel 21, that are oppositely disposed in the second direction Y. In some examples, the display assembly 2 includes a plurality of first driving circuit boards 4. The plurality of first driving circuit boards 4 are disposed at one of the two edges, of the display panel 21, that are oppositely disposed in the second direction Y. In some other examples, as shown in FIG. 9, the display assembly 2 includes a plurality of first driving circuit boards 4. Some of the plurality of first driving circuit boards 4 is disposed at one of the two edges, of the display panel 21, that are oppositely disposed in the second direction Y, and the rest of the plurality of first driving circuit boards 4 is disposed at the other of the two edges, of the display panel 21, that are oppositely disposed in the second direction Y.

As shown in FIG. 10, each first driving circuit board 4 is located on a side of the display panel 21 proximate to the backplate 22 and extends beyond the edge of the display panel 21. The first driving circuit board 4 is located among the side frame, the elastic clamping portion 32, and the display panel 21. In this way, it is possible to ensure that the first driving circuit boards 4 will not be exposed outside the display assembly 2, thus the first driving circuit boards 4 may be protected, and a tidy and aesthetic appearance of the display assembly 2 is ensured. For example, the first driving circuit board 4 includes a first film 41 and a source driving integrated circuit (IC) 42 disposed on the first film 41, and the source driving IC 42 is located on a surface of the first film 41 away from the display panel 21. When the first driving circuit board 4 is fixed, an end of the first film 41 is fixed to a back side of the display panel 21 facing the backplate 22, and a remaining portion of the first film 41 extends out of the display panel 21, and is then reversely folded to the back side of the display panel 21.

Figure 11:
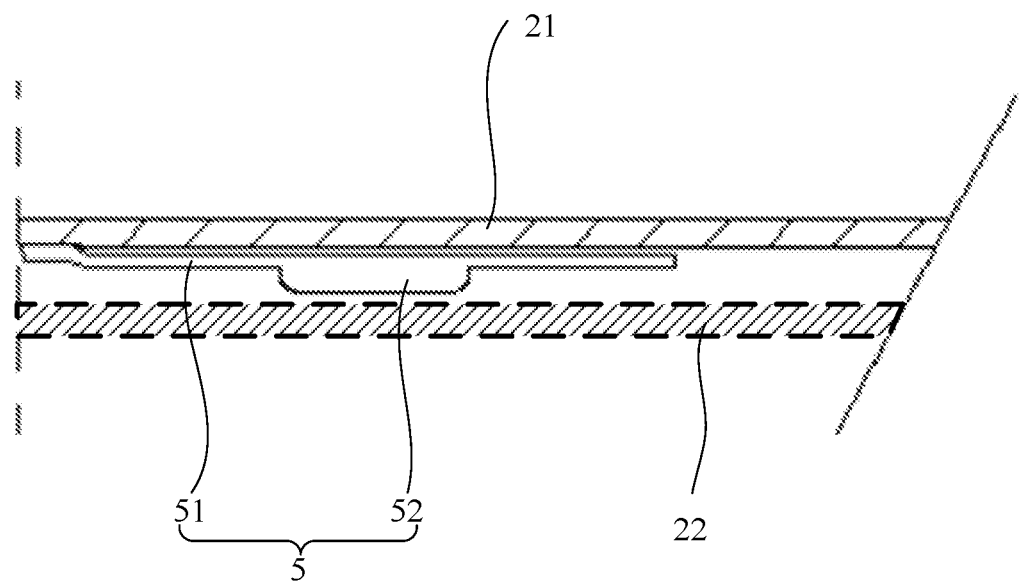
FIG. 11 is a sectional view taken along the line B-B' in FIG. 9.

In some embodiments, as shown in FIGS. 9 and 11, the curved display assembly 2 further includes at least one second driving circuit board 5, and the at least one second driving circuit board 5 is disposed at at least one of the two edges, of the display panel 21, that are oppositely disposed in the first direction X. In some examples, as shown in FIG. 9, the display assembly 2 includes a plurality of second driving circuit boards 5. The plurality of second driving circuit boards 5 are disposed at one of the two edges, of the display panel 21, that are oppositely disposed in the first direction X. In some other examples, the display assembly 2 includes a plurality of second driving circuit boards 5. Some of the plurality of second driving circuit boards 5 is disposed at one of the two edges, of the display panel 21, that are oppositely disposed in the first direction X, and the rest of the plurality of second driving circuit boards 5 is disposed at the other of the two edges, of the display panel 21, that are oppositely disposed in the first direction X.

As shown in FIG. 11, each second driving circuit board 5 is located on the side of the display panel 21 proximate to the backplate 22, and an orthographic projection of the second driving circuit board 5 on the backplate 22 is located within a range of an orthographic projection of the display panel 21 on the backplate 22. The second driving circuit board 5 does not extend beyond the edge of the display panel 21, and is always shielded by the display panel 21 and the backplate 22, and cannot be seen from the outside. Based on this, there is no need to design a corresponding structure at the flanged portion 121 of the hemming bracket 12 to shield and avoid the second driving circuit board 5. For example, the second driving circuit board 5 includes a second film 51 and a source driving IC 52 disposed on the second film 51, and the source driving IC 52 is located on a surface of the second film 51 away from the display panel 21.

Figure 12:
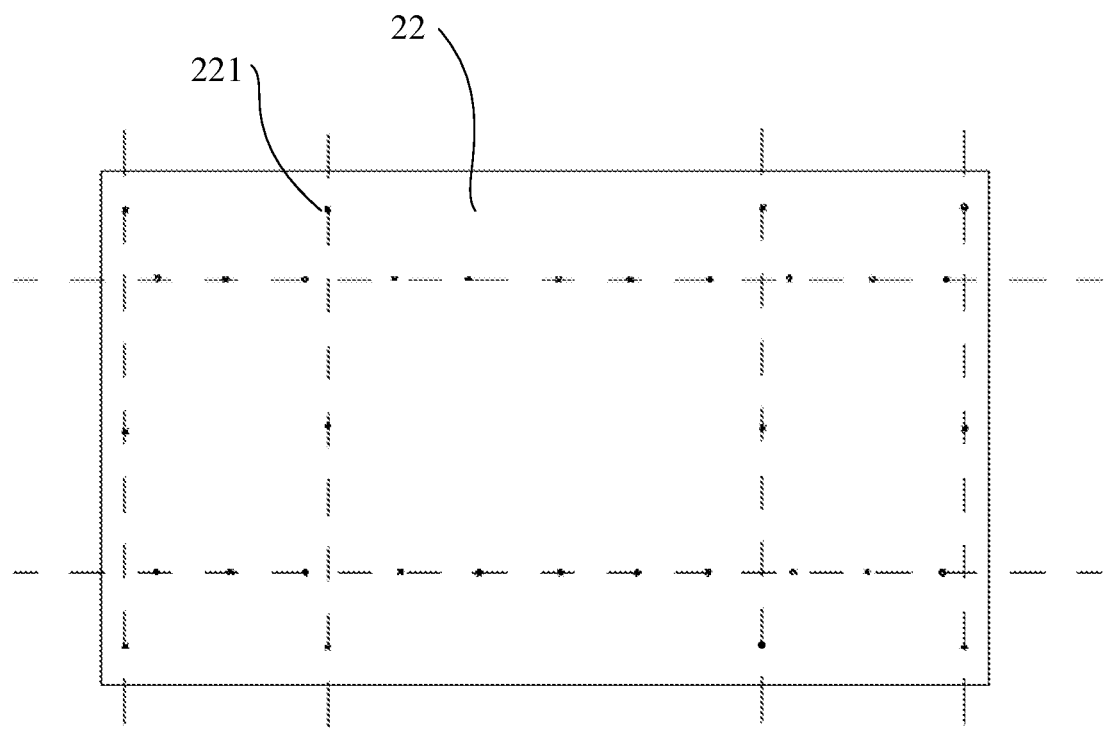
FIG. 12 is a distribution diagram of protrusions in a display assembly, in accordance with some embodiments.

In some embodiments, as shown in FIG. 1A, in a case where a plurality of mounting holes 15 are disposed on the frame 1, as shown in FIG. 12, a plurality of protrusions 221 are disposed on a surface of the backplate 22 facing the support assembly 11. The plurality of protrusions 221 are configured to cooperate with the plurality of mounting holes 15, so that the frame 1 and the backplate 22 may be positioned quickly. For example, as shown in FIG. 13, the plurality of protrusions 221 are in a one-to-one correspondence with the plurality of mounting holes 15, and each protrusion 221 may be inserted into one mounting hole 15 to form a shaft-hole type positioning relationship.

In the description of the above embodiments, specific features, structures, materials or characteristics may be combined in any one or more embodiments or examples in any suitable manner.

The foregoing descriptions are merely specific implementations of the present disclosure, but the protection scope of the present disclosure is not limited thereto. Changes or replacements that a person skilled in the art could conceive of within the technical scope of the present disclosure shall be included in the protection scope of the present disclosure.

Therefore, the protection scope of the present disclosure shall be subject to the protection scope of the claims.

What is claimed is:
1. A frame, comprising:
a support assembly extending in a first direction;
two hemming brackets respectively disposed at both sides of the support assembly in the first direction; each hemming bracket extending in a second direction, and an end of the hemming bracket away from the support assembly being a flanged portion; and
at least two detachable fixing structures, the hemming bracket being fixed to a corresponding end of the support assembly through at least one detachable fixing structure; one of the hemming bracket and the end of the support assembly having at least one via hole, and each detachable fixing structure passing through a via hole to be fixed to another of the hemming bracket and the end of the support assembly; and an outer wall of the detachable fixing structure and a hole wall of the via hole having a gap therebetween;
wherein the first direction and the second direction are different, and a plane in which the first direction and the second direction are located is perpendicular to a thickness direction of the frame.
2. The frame according to claim 1, wherein the hemming bracket includes a connection portion, the connection portion and the flanged portion form an L-shaped structure; and
the connection portion and the end of the support assembly are stacked in the thickness direction of the frame, and the at least one via hole is disposed in one of the connection portion and the end of the support assembly.
3. The frame according to claim 2, wherein an angle formed by the connection portion and the flanged portion at a connection therebetween is an arc-shaped chamfering.
4. The frame according to claim 2, wherein the connection portion includes a first connection sub-portion and a second connection sub-portion, wherein
the first connection sub-portion is located between the second connection sub-portion and the flanged portion, and is connected to the second connection sub-portion and the flanged portion; and the first connection sub-portion and the support assembly are non-overlapping in the thickness direction of the frame; and
the second connection sub-portion and the end of the support assembly are stacked in the thickness direction of the frame, and the at least one via hole is disposed in the second connection sub-portion.
5. The frame according to claim 4, wherein at least one threaded hole is disposed on a surface of the end of the support assembly facing the second connection sub-portion; and
the detachable fixing structure includes a fastener with a thread, the fastener with the thread passes through a via hole disposed in the second connection sub-portion to be fixedly connected to a corresponding threaded hole, and the via hole is a counter bore.
6. The frame according to claim 4, wherein the support assembly has an upper surface and a lower surface disposed oppositely, a portion of the lower surface at each end of the support assembly is recessed toward the upper surface relative to a portion of the lower surface in a remaining region of the support assembly; and
the second connection sub-portion is located at a side of the lower surface of the support assembly; and the connection portion has a top surface and a bottom surface disposed oppositely, and a portion of the top surface in the second connection sub-portion is in contact with a portion of the lower surface at the end of the support assembly.

7. The frame according to claim 6, wherein the bottom surface of the connection portion and the portion of the lower surface in the remaining region of the support assembly are located in a same plane, the plane is perpendicular to the thickness direction of the frame.

8. The frame according to claim 6, wherein the upper surface is an arc-shaped surface, an extending direction of an orthographic projection of each of curved sides of the arc-shaped surface on the plane is parallel to the first direction, and the arc-shaped surface and the flanged portion are located at a same side of the frame; and
- a portion of the top surface in the first connection sub-portion is an inclined surface, and the inclined surface is tangent to an edge of the arc-shaped surface proximate to the inclined surface.

9. The frame according to claim 1, wherein the support assembly includes at least one support member, each support member is in an arcuate shape, and an upper surface of the support member is an arc-shaped surface; an extending direction of an orthographic projection of each of curved sides of the arc-shaped surface on the plane is parallel to the first direction, and the arc-shaped surface and the flanged portion are located at the same side of the frame.

10. The frame according to claim 9, wherein the support assembly includes at least two support members, any two adjacent support members of the at least two support members are space apart in the second direction; and
- an end of each support member is fixed to the hemming bracket through at least one detachable fixing structure.

11. The frame according to claim 10, wherein at least one opening is disposed on each support member, the at least one opening penetrates the support member in the second direction.

12. The frame according to claim 10, further comprising:
- at least one bracket, each bracket extending in the second direction; and the at least one bracket being disposed between the two hemming brackets, and being fixedly connected to the at least two support members.

13. The frame according to claim 12, wherein a plurality of mounting holes are disposed on the support assembly, the bracket, and the hemming brackets, the plurality of mounting holes and the flanged portion are located at the same side of the frame, and the plurality of mounting holes are uniformly distributed.

14. A display apparatus, comprising:
- the frame according to claim 1; and
- a display assembly including a display panel and a backplate;
- wherein the backplate is disposed on the support assembly and is in contact with the support assembly, the display panel is located at a side of the backplate away from the support assembly, and the two hemming brackets are located at two edges of the display assembly in the first direction.

15. The display apparatus according to claim 14, wherein the display assembly is a curved display assembly.

16. The display apparatus according to claim 14, wherein the display assembly further includes two protection frames; the two protection frames are disposed at two edges, of the display assembly, that are oppositely disposed in the second direction, each protection frame is in contact with one of two side faces, of the display panel, that are oppositely disposed in the second direction.

17. The display apparatus according to claim 16, wherein the protection frame includes a side frame and an elastic clamping portion connected to the side frame; the elastic clamping portion is clamped into a gap between the backplate and the display panel, and the side frame is in contact with a side face of the display panel; and
- the protection frame further includes a position-limiting platform disposed at an edge of a surface of the elastic clamping portion away from the display panel; an edge portion of the backplate is disposed on surface of the elastic clamping portion away from the display panel, and a side face of the backplate located at the edge portion and a side wall of the position-limiting platform have a gap therebetween.

18. The display apparatus according to claim 17, wherein the display assembly further includes at least one first driving circuit board, the at least one first driving circuit board is disposed at at least one edge of two edges, of the display panel, that are oppositely disposed in the second direction; and
- each first driving circuit board is located at a side of the display panel proximate to the backplate and extends beyond the edge of the display panel, and the first driving circuit board is located among the side frame, the elastic clamping portion, and the display panel.

19. The display apparatus according to claim 15, wherein the display assembly further includes at least one second driving circuit board, the at least one second driving circuit board is disposed at at least one edge of two edges, of the display panel, that are oppositely disposed in the first direction;
- each second driving circuit board is located at the side of the display panel proximate to the backplate, and an orthographic projection of the second driving circuit board on the backplate is located within a range of an orthographic projection of the display panel on the backplate.

20. The display apparatus according to claim 15, wherein a plurality of mounting holes are disposed on the frame; and a plurality of protrusions are disposed on a surface of the backplate facing the support assembly, and are configured to cooperate with the plurality of mounting holes.

* * * * *